(12) United States Patent  (10) Patent No.: US 7,281,180 B2
Furuyama et al.  (45) Date of Patent: Oct. 9, 2007

(54) MEMORY SYSTEM AND TEST METHOD THEREFOR

(75) Inventors: Takaaki Furuyama, Kani (JP); Satoru Kawamoto, Owariasahi (JP)

(73) Assignee: Spansion LLC, Sunnyvale, CA (US)

( * ) Notice: Subject to any disclaimer, the term of this patent is extended or adjusted under 35 U.S.C. 154(b) by 127 days.

(21) Appl. No.: 11/173,735

(22) Filed: Jul. 1, 2005

(65) Prior Publication Data

US 2006/0002196 A1  Jan. 5, 2006

Related U.S. Application Data

(63) Continuation of application No. PCT/JP04/009414, filed on Jul. 2, 2004.

(51) Int. Cl.
*G11C 29/00* (2006.01)
*G11C 7/00* (2006.01)

(52) U.S. Cl. ........................ 714/718; 365/201
(58) Field of Classification Search .................... None
See application file for complete search history.

(56) References Cited

U.S. PATENT DOCUMENTS

| 5,297,029 | A |   | 3/1994 | Nakai et al. |
| 5,677,913 | A | * | 10/1997 | Aybay ........................ 714/720 |
| 6,574,763 | B1 | * | 6/2003 | Bertin et al. ................ 714/738 |
| 2001/0022744 | A1 |   | 9/2001 | Noda et al. |

FOREIGN PATENT DOCUMENTS

| JP | 404148446 A | * | 5/1992 |
| JP | 05-054684 |   | 3/1993 |
| JP | 05-087890 |   | 4/1993 |

(Continued)

OTHER PUBLICATIONS

"Automated Test Equipment for Research on Nonvolatile Memories" by Pellati et al. This paper appears in: IEEE Transactions on Instrumentation and Measurement, Publication Date: Oct. 2001 vol.: 50, Issue: 5 pp. 1162-1166 ISSN: 0018-9456 INSPEC Accession No.: 7164900.*

(Continued)

*Primary Examiner*—Cynthia Britt
(74) *Attorney, Agent, or Firm*—Ingrassia Fisher & Lorenz, PC

(57) ABSTRACT

A memory system (1A) includes a memory section (2A) and a memory control section (3A). The memory section (2A) includes a test circuit (4A), a data register (5A), a data output section (6A), and a memory core section (9A). Data DI is held in the data resistor (5A). The test circuit (4A) outputs write inhibit signal WINH to the memory core section (9A) in response to test signal TEST. Write instruction recognition signal WR which recognizes that a write command is inputted into the memory section (2A) and select signal S are inverted and, in response thereto, retained data DR of the data register (5A) is outputted as output data DO from the data output section (6A). Thus, it is possible to test whether generation, propagation, or recognition operation of a write command CMD and the data DI is normal or not without executing the operation of writing data into a memory cell of the memory section.

29 Claims, 12 Drawing Sheets

FOREIGN PATENT DOCUMENTS

| | | |
|---|---|---|
| JP | 05-198200 | 8/1993 |
| JP | 11-101858 | 4/1999 |
| JP | 11-272643 | 10/1999 |
| JP | 2000-346905 | 12/2000 |
| JP | 2001-256213 | 9/2001 |

OTHER PUBLICATIONS

"Using Device ATE Testers to Solve Anomalies" by Swail This paper appears in: AUTOTESTCON Proceedings, 2002. IEEE Publication Date: 2002 pp.: 650-660 ISSN: 1080-7725 INSPEC Accession No.: 7597176.*

* cited by examiner (SELECT DR)
(SELECT DMC)

MEMORY SYSTEM AND TEST METHOD THEREFOR

CROSS-REFERENCES TO RELATED APPLICATIONS

This is a continuation of International Application No. PCT/JP2004/009414, filed Jul. 2, 2004 which was not published in English under PCT Article 21(2).

TECHNICAL FIELD

The present invention relates to an access operation test for a memory section in a memory system, and more particularly to an access operation test for a memory section in the case of access operations which take a longer time than the operation speed of the memory system.

BACKGROUND

Prior Art

Conventionally, in a microcomputer with a built-in flash memory as disclosed in Japanese Kokai Publication No. 2001-256213 ("Patent Document 1"), shown in FIG. 14, when value "1" (H level) is set in a control bit of FTEST select register 626 in an erase voltage generating circuit and its peripheral circuits, a switch section 630 connects change terminal 630a and change terminal 630b, and an erase voltage supply end 249 is set to a ground potential. Erase pulse signal ERSM supplied from input terminal 620 is outputted to signal output pad P1 by way of buffer 628, and erase pulse signal ERSM can be externally detected. After input of an erase command, the erase operation is checked to determine if correct or not, by checking if erase pulse signal ERSM is outputted or not outputted from the memory cell subject to be erased to the outside of the microcomputer by way of signal output pads P1 to Pn.

A semiconductor memory IC disclosed in Japanese Kokai Publication No. H5-198200 ("Patent Document 2") comprises, as shown in FIG. 15, memory cells A1, A2; signal lines L1, L3 for writing data D1, D3 into memory cells A1, A2, respectively; signal lines L5, L6 for reading out memory data D5, D6; signal lines L2, L4 branched from the signal lines L5, L6; selectors S1, S2 for selecting data D1 or D5 and data D3 or D6, respectively; correction circuit C for receiving signals D7, D8 outputted from selectors S1, S2; and signal line L9 for outputting correction circuit signal D9 from correction circuit C. The selectors S1, S2 are set to select input data D1, D3 during a test mode. When normal data D1R is entered on signal line L1, correction circuit C insures that data D9 is the normal data and is outputted without correction. When wrong data DIE is entered on signal line L1, correction circuit C insures that corrected normal data D1R is outputted on signal line L9. In the test mode of the correction circuit C, by directly selecting input data and supplying it from the correction circuit C, data writing or reading in the memory cell is not required, and, thus, the test time is shortened.

In the semiconductor integrated circuit disclosed in Japanese Kokai Publication No. H11-101858 ("Patent Document 3"), as shown in FIG. 16, operation of each address can be checked by comparing the address data of the input address signal and the output address data from address shift register 100.

During a write operation, data signals outputted from external signal input and output pads 103, 104 to bus wirings 143, 144 by way of wirings 123, 124 and logic section 1000 are stored in data shift register 200 through wirings 153, 154. The data signals stored in the data shift register 200 are serially outputted therefrom to pad 107 as write data by way of data output line 127.

During a read operation, a counter 300 is used in place of a memory cell, and the operation is checked. First, the counter 300 is initialized, and predetermined data is preset in the counter 300. Next, a clock signal is entered in the counter 300 from clock pad 108 by way of clock line 128, and the data signal of the data preset in the counter 300 is outputted from the counter 300. The logic section 1000 takes in the data signal outputted from the counter 300, and outputs it to pads 103, 104. When the data of the data signal outputted to the pads 103, 104 and the data set in the counter 300 are equal to each other, the operation of this data line is normal.

Problems to Be Solved by the Invention

In Patent Document 1, without actually erasing by generating erase voltage in the flash memory with a built-in in the microcomputer, erase pulse signal ERSM is outputted to signal output pad P1 by way of buffer 628, and the erase operation is checked to determine whether it is correct or wrong. However, nothing is disclosed about operations other than the erase operation. In the read operation or the write operation, it is required to recognize the address information or data information, or recognize information not used in the erase operation. To check if the address information and data information are recognized correctly or not, actual access to the memory cell may be necessary, and a very long test time may be needed in the case of large storage capacity or longer access time to memory cell may be needed as compared with the circuit operation.

Also in Patent Document 1, to determine whether the erase operation is correct or not, signal output pads P1 to Pn are needed exclusively for the test. Special pads are necessary for test, thereby increasing the chip area.

In Patent Document 2, during the test mode of the correction circuit, input data D1, D3 are selected by selectors S1, S2, and put into the correction circuit. However, nothing is mentioned about confirming whether the internal control operation is normal or not in regards to the command input when writing or reading data, and nothing is disclosed about the confirmation of normal address recognition or internal control in regards to the address information to be entered. When checking the command or address, writing or reading operations of data in the memory cell may be needed, and the test time may not be shortened in such a case.

In Patent Document 3, the operation of the logic section is tested without operating the memory section 3000. However, when testing by write/read operations, exclusive test circuits are necessary for confirming normal address input or normal data input, or generating expectation value data for data output, and the circuit configuration is complicated and the chip size is increased. Moreover, in the exclusive test circuits, routing is different from propagation routing of address and data during normal operation. As a specific operation may occur in testing, the circuit in the memory section cannot be tested.

Further, nothing is disclosed about confirming whether the internal control operation is normal or not in regards to the command input during write/read operations. Defective operation may, thus, not be confirmed in regards to the internal operation when recognizing the command.

SUMMARY OF THE INVENTION

The present invention is devised to solve at least one of the problems of the prior art, and it is hence an object of the present invention to present a memory system capable of checking the internal control operation of a memory control section or a memory section, and checking the wiring of each signal route, in simple configuration and procedure not accompanied by an increase in chip size and without requiring a data writing operation into the memory cell when testing the access operation of writing or reading in the memory section by control of the memory control section and its test method.

To achieve the object, the memory system of the present invention comprises a memory control section for providing a data write instruction and a memory section for storing and providing data in response to the memory control section, the memory section comprising a data output section for providing data to the memory control section upon recognition of the data write instruction during test.

In the memory system of the invention, at the time of testing when the memory section recognizes the write instruction outputted from the memory control section, the data output section outputs the input data toward the memory control section.

The test method of a memory system in accordance with the present invention is a test method of a memory system comprising a memory control section for providing a data write instruction and a memory section for storing and providing data in response to the memory control section. In the memory section, the data is outputted to the memory control section upon recognition of the data write instruction.

In the test method of a memory system in accordance with the present invention, when the memory section recognizes the write instruction outputted from the memory control section, the input data is outputted toward the memory control section.

Accordingly, by issuing the input data from the data output section, it is possible to recognize that a write instruction is normally generated in the memory control section, that the generated write instruction is normally put into the memory section, and that the write instruction is normally recognized in the memory section depending on the entered write instruction. It is thus tested whether the write instruction is recognized correctly or not in the memory section.

In particular, when taking a longer time in a data write operation in a memory cell as compared with a control circuit operation, the test time for a write instruction can be shortened.

Herein, when taking a longer time in a data write operation in a memory cell (e.g., a nonvolatile memory capable of rewriting electrically, such as flash memory), the test time for a write instruction can be shortened in the memory system having the memory section taking a long time in the write operation of data into the memory cell.

The invention, thus, provides a memory system capable of checking the generation of an access command in a memory control section, internal control operation of the memory section in regards to an access command input, and wiring of signal routes of access commands and data in a simple configuration and procedure not requiring an increase in chip size, when testing the access operation of writing or the like in the memory section by control of the memory control section.

Figure 1:
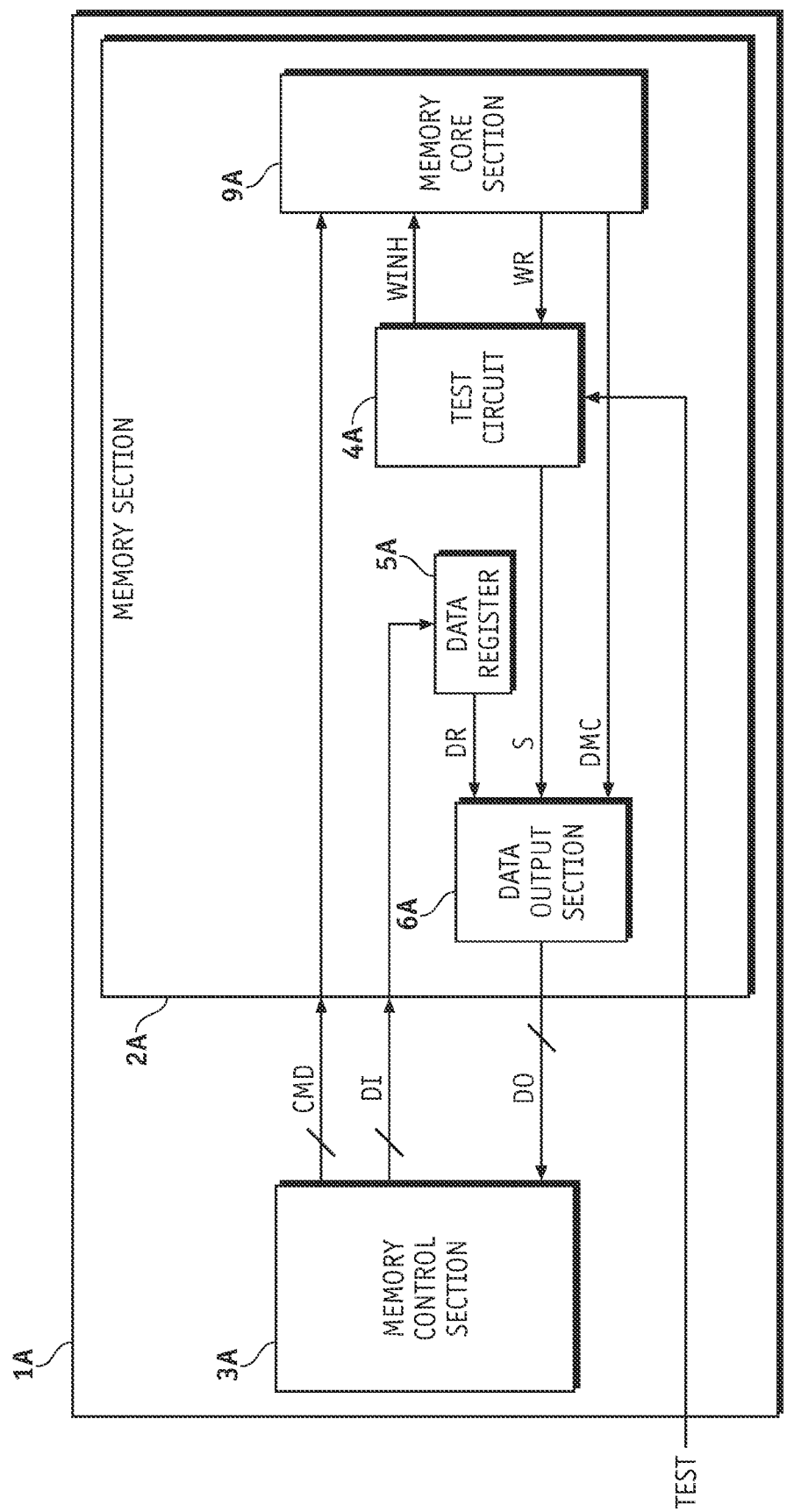
FIG. 1 is a block diagram showing a first embodiment of the present invention.

DESCRIPTION OF REFERENCE NUMERALS 1A, 1B, 1C Memory system
2A, 12A, 2B, 12B, 2C, 12C Memory section
3A, 3B, 3C Memory control section
4A, 14A, 4B, 14B, 4C, 14C Test circuit
5A, 15A, 5B, 15B, 5C, 15C Data register
61, 16A, 6B, 16B, 6C, 16C Data output section
7B, 17B Address register section
8B, 18B Comparator
9A, 19A, 9B, 19B, 9C, 19C Memory core section
21A, 21B, 21C Command data
22A, 22B, 22C Data input buffer
23B Address input buffer
24A, 24B, 24C Write control circuit
25A, 25B, 25C Write circuit
26C Read control circuit
27A, 27B, 27C Read circuit
28A, 28B, 28C Memory cell array
ADD, ADD1, ADD2 Address signal
CMD Access command (write command, read command)
DI Data
DO Output data
E Comparison coincidence signal
RCMD Read command
RR Read instruction recognition signal
RR1 Data output signal
S Select signal
TEST Test signal
WCMD Write command WINH Write inhibit signal
WR Write instruction recognition signal
WR1 Data acquisition signal
WR2 Write execution signal

DETAILED DESCRIPTION OF THE INVENTION

Figure 12:
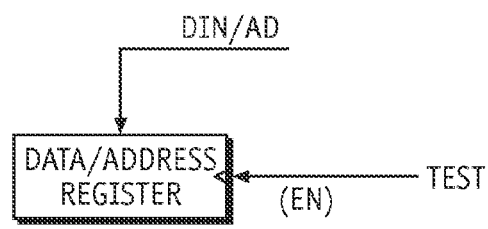
FIG. 12 is a diagram showing a measure for reducing current consumption when not testing in a data/address register.
Figure 13:
FIG. 13 is a diagram showing a measure for reducing current consumption when not testing in a comparator.
Figure 14:
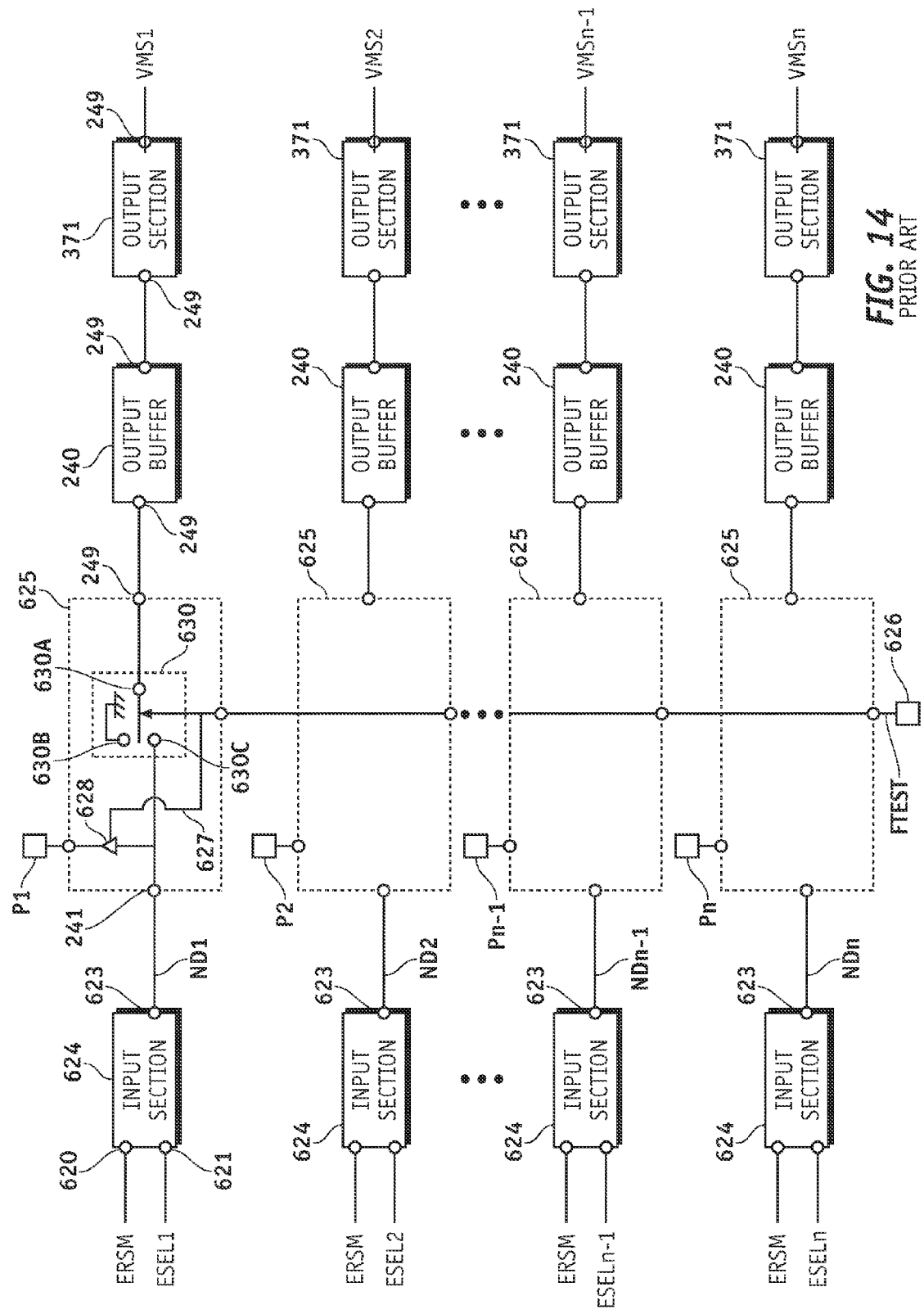
FIG. 14 is a conventional circuit diagram in accordance with Japanese Kokai Publication No. 2001-256213.
Figure 15:
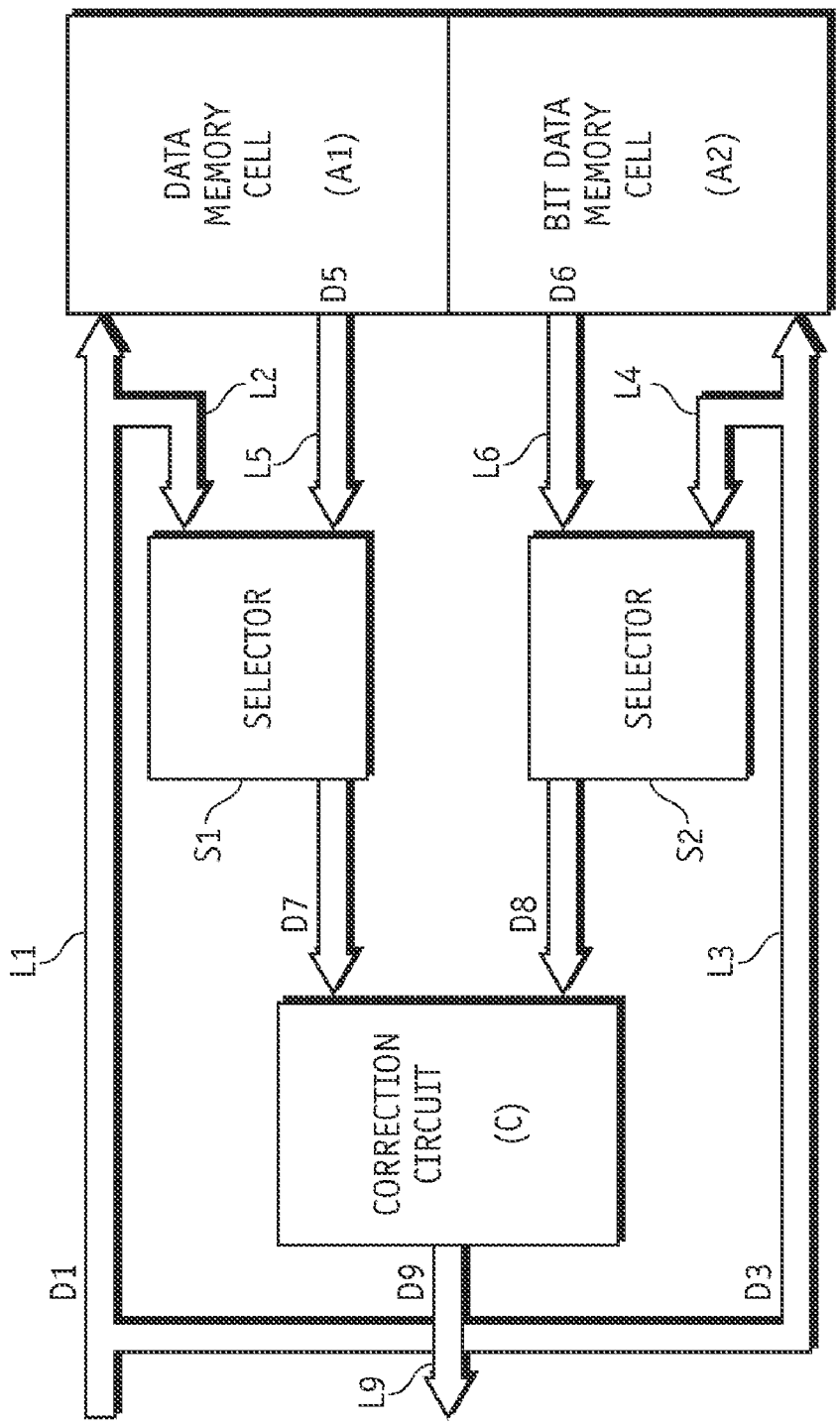
FIG. 15 is a conventional circuit block diagram in accordance with Japanese Kokai Publication No. H5-198200.
Figure 16:
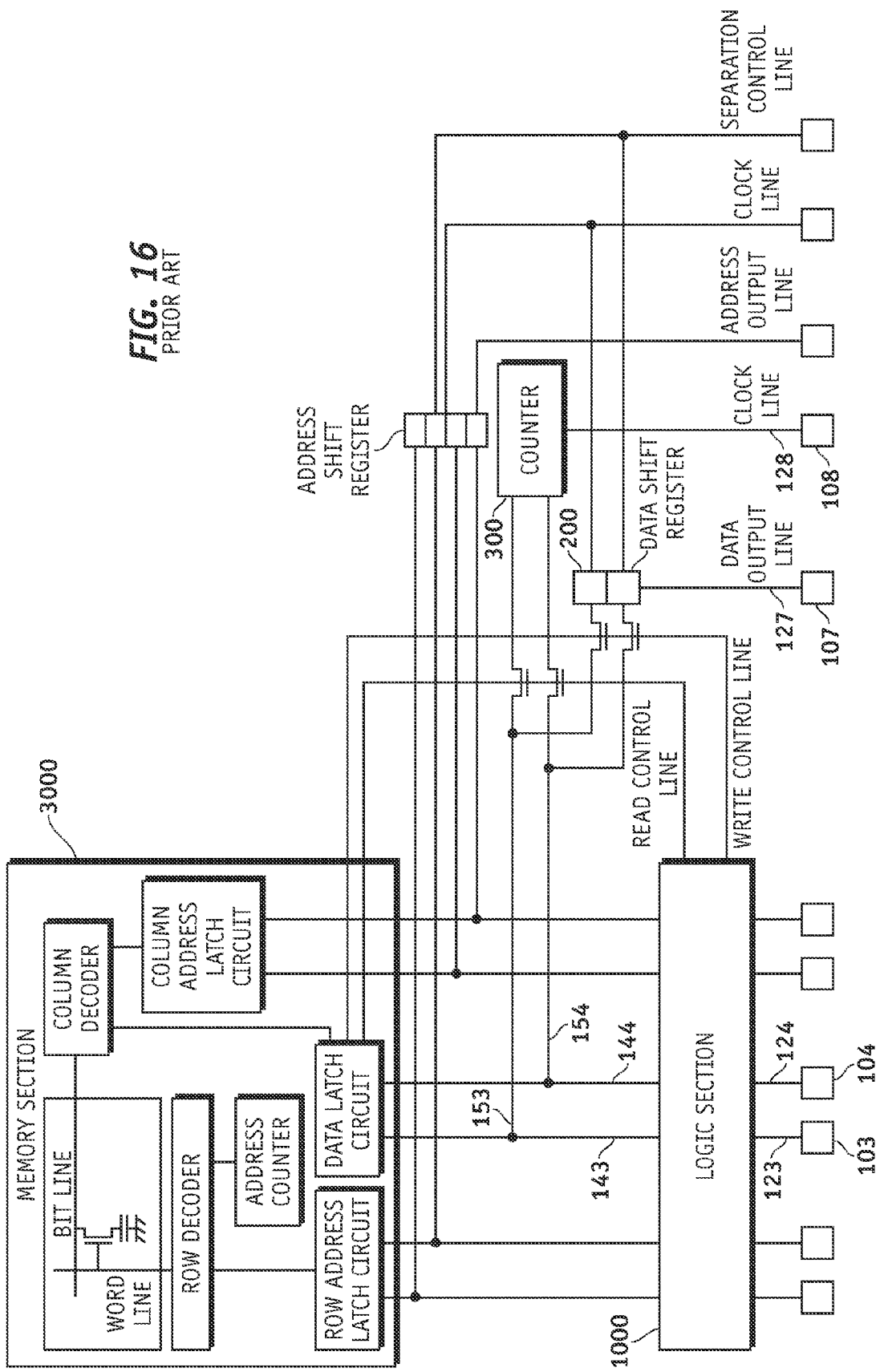
FIG. 16 is a conventional circuit block diagram in accordance with Japanese Kokai Publication No. H11-101858.

Exemplary embodiments of the memory system and a test method in accordance with the present invention are specifically described below while referring to FIG. 1 to FIG. 13. FIG. 1 to FIG. 4 refer to a first embodiment of the present invention, FIG. 5 to FIG. 8 refer to a second embodiment of the present invention, and FIG. 9 to FIG. 11 refer to a third embodiment of the present invention. FIG. 12 and FIG. 13 refer to an embodiment of the present invention depicting reduction of current consumption when not testing.

FIG. 1 is a block diagram showing a first embodiment of the present invention. A memory system 1A comprises a memory section 2A and a memory control section 3A. The memory control section 3A sends out access command CMD and data DI to the memory section 2A, and receives output data DO from the memory section 2A.

The memory section 2A includes a memory core section 9A for input and output of data DI/DMC in a memory cell array (not shown) depending on access command CMD, data DI/DMC, and an address signal (not shown). The data DI is inputted into the memory core section 9A by way of an input route not shown.

Further, the memory section 2A includes a test circuit 4A, a data register 5A, and a data output section 6A. The test circuit 4A is activated by test signal TEST and outputs a write inhibit signal WINH to the memory core section 9A. It also receives a write instruction recognition signal WR outputted when the memory core section 9A recognizes a write command. Further, a select signal S, inverted depending on presence or absence of write instruction recognition signal WR, is outputted to the data output section 6A.

In the data register 5A, data DI outputted from the memory control section 3A is entered and held. The retained data DR is outputted to the data output section 6A.

The data output section 6A receives the retained data DR outputted from the data register 5A and the cell data DMC outputted from the memory core section 9A, and selects either one depending on the select signal S outputted from the test circuit 4A to output as output data DO to the memory control section 3A.

When the test signal TEST is activated in the test state, write inhibit signal WINH is outputted from the test circuit 4A, and the write operation in a memory cell of memory core section 9A is inhibited regardless of the write command. In this state, the memory control section 3A outputs write command CMD and data DI. The data DI is held in the data register 5A and the write command CMD is inputted to the memory core section 9A. In the memory core section 9A, the command is decoded, and when it is recognized as write command CMD, a write instruction recognition signal WR is generated. The write instruction recognition signal WR is a control signal when taking in the data DI or writing into the memory cell in the memory core section 9A. However, at the time of testing, writing into the memory cell is inhibited by the write inhibit signal WINH.

The test circuit 4A inverts the select signal on the basis of generation of the write instruction recognition signal WR. That is, the select signal S is inverted when the write command CMD outputted from the memory control section 3A is a command transmitted to the memory core section 9A in the memory section 2A which, when decoded in the memory core section 9A, is recognized to be a write command.

The data output section 6A usually selects cell data DMC to output as output data DO. Only when the select signal S is inverted, the output data DO is switched to the retained data DR. As a result, at the time of testing when the write command CMD is recognized, the data DI entered along with the write command CMD is outputted as output data DO without being written into the memory cell.

It is therefore possible to confirm operations, such as generation of write command CMD and data DI in the memory control section 3A, recognition of the write command by a command decoder in the memory section 2A and generation of the write instruction recognition signal WR by its recognition and confirmation of signal routes of write command CMD and data DI, DO, without executing the write operation of data into the memory cell.

Figure 2:
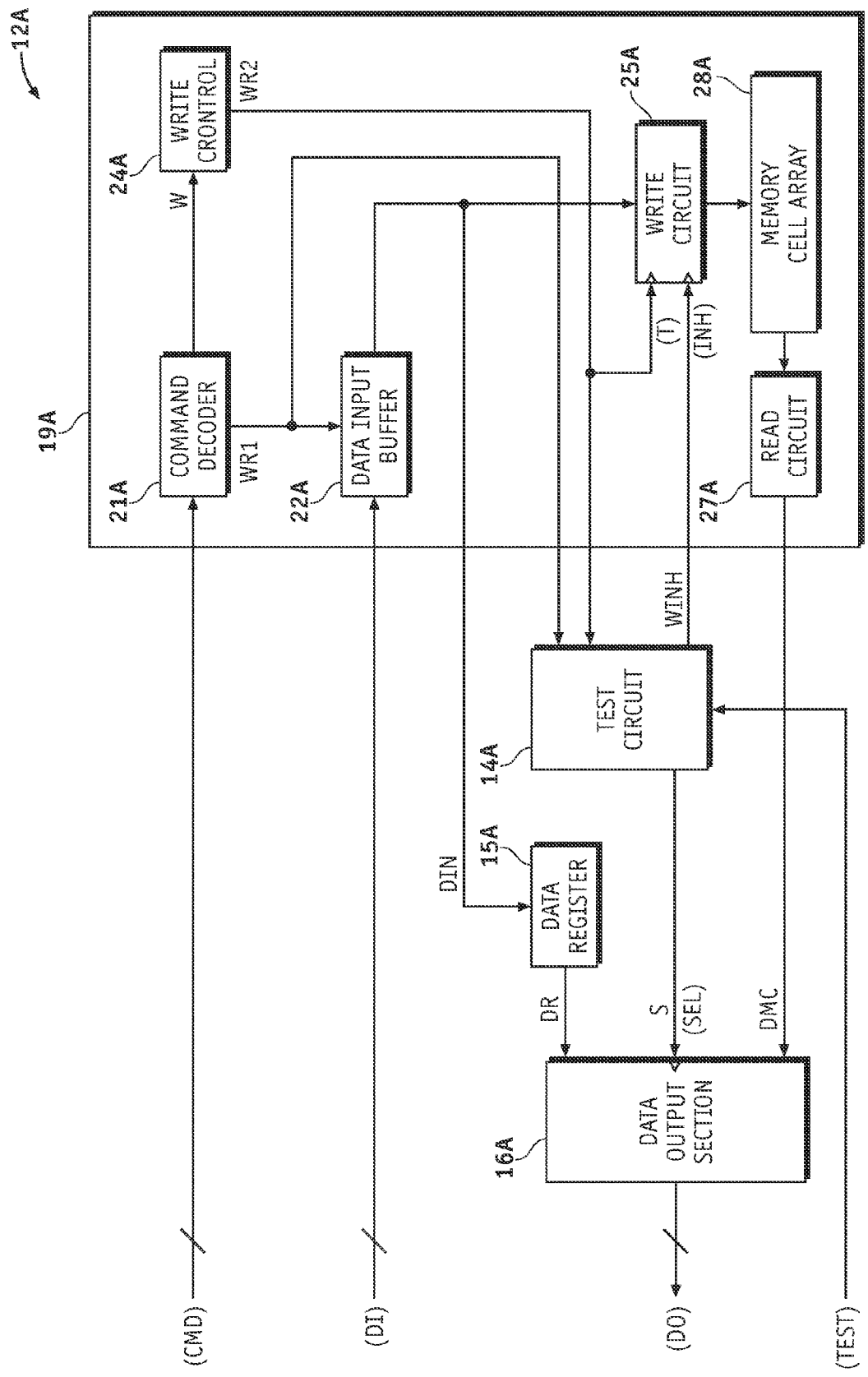
FIG. 2 is a circuit block diagram showing a memory section in accordance with the first embodiment of FIG. 1.
Figure 3:
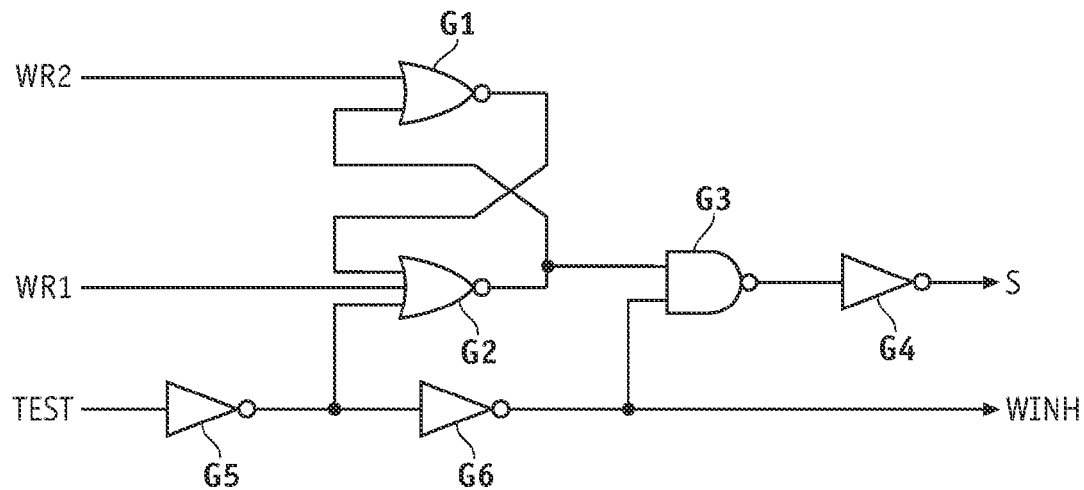
FIG. 3 is a circuit example of test circuit in accordance with the first embodiment of FIG. 1.
Figure 4:
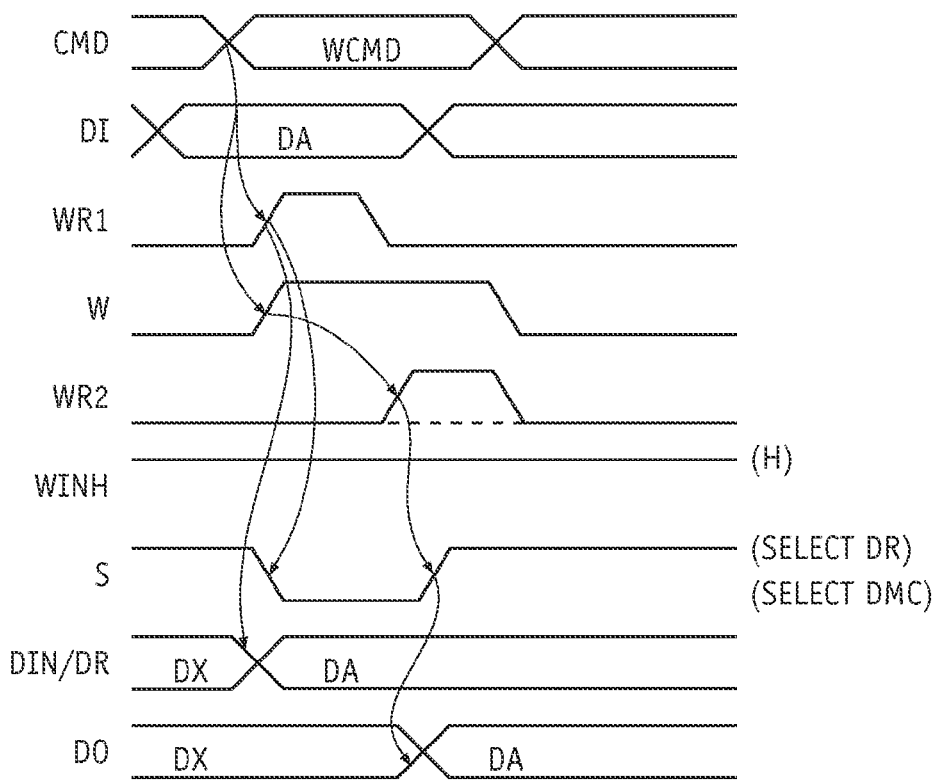
FIG. 4 is an operation waveform showing a test procedure in accordance with the first embodiment of FIG. 1.

The first embodiment is shown in more detail in FIG. 2 to FIG. 4. FIG. 2 is a circuit block diagram of memory section 12A in the first embodiment. A memory core section 19A comprises a command decoder 21A, a data input buffer 22A, a write control circuit 24A, a write circuit 25A, a read circuit 27A, and a memory cell array 28A, and receives access command CMD and data DI from the memory control section not shown.

The command decoder 21A receives access command CMD, and the data input buffer 22A receives data DI. Write signal W outputted from the command decoder 21A is inputted into the write control circuit 24A. Data uptake signal WR1 is inputted into the data input buffer 22A and test circuit 14A.

An output terminal of the data input buffer 22A is connected to the write circuit 25A and also connected to the data register 15A, and uptake data DIN taken into the data input buffer 22A is outputted to the write circuit 25A and data register 15A.

An output terminal of the write control circuit 24A is connected to a trigger terminal (T) of the write circuit 25A and also connected to the test circuit 14A. Write execute signal WR2 outputted on the basis of the write signal W outputted from the command decoder 21A is outputted into the write circuit 25A and test circuit 14A.

An output terminal of the write circuit 25A is connected to the memory cell array 28A for executing the write operation of uptake data DIN into the memory cell array 28A on the basis of the write execute signal WR2 entered in the trigger terminal (T).

The read circuit 27A is connected to the memory cell array 28A and outputs the cell data DMC of the memory cell to the data output section 16A.

The test circuit 14A outputs write inhibit signal WINH and select signal S. The write inhibit signal WINH is put into an inhibit terminal (INH) of the write circuit 25A. The select signal S is put into a select terminal (SEL) of the data output section 16A.

The data register 15A outputs the held retained data DR to the data output section 16A. The data output section 16A selects either the retained data DR or the cell data DMC depending on the select signal S to output as output data DO.

A circuit example of the test circuit 14A is shown in FIG. 3. NOR gates G1, G2 have their output terminals connected to the input terminals of each other, and the gate G1 receives a write execute signal WR2 while the gate G2 receives a data uptake signal WR1, thereby together forming a flip-flop circuit. Further, the gate G2 receives an inverted signal of test signal TEST from the output of an inverter gate G5. An output terminal of the gate G2 is the output terminal of the flip-flop circuit, and is inputted into a NAND gate G3, together with an in-phase signal of test signal TEST by way of inverter gates G5 and G6. An output terminal of the gate G3 is connected to an inverter gate G4 which outputs the select signal S.

An inverted signal of test signal TEST outputted from the gate G5 serves as the reset signal of the flip-flop circuit. When not testing (TEST=Lo), the flip-flop circuit is reset, and a signal of low level is outputted from the gate G2. In addition, because the output signal from the gate G6 is at a low level, the signal level of the select signal S is also at low level. As the select signal S is low level, cell data DMC is selected as output data DO, and the data is outputted from the memory cell array 28A (FIG. 2) when not testing.

When testing (TEST=Hi), output signals from gates G5 and G6 are respectively at low level and high level, and the reset state of the flip-flop circuit is cleared, the input and output response of the gate G3 operate as a logic inversion function, and a signal in phase with the output signal of the flip-flop circuit is outputted as select signal S. Along with the input of a write command, the generated data uptake signal WR1 is activated (WR1=Hi), and the output signal of the flip-flop circuit becomes low level and the select signal S also becomes low level.

After the data uptake signal WR1 has been activated, the write execute signal WR2 generated at a predetermined timing is activated (WR2=Hi) and the output signal of the flip-flop circuit is inverted to a high level and the select signal S also becomes high level. The select signal S is set to a low level by the data uptake signal WR1 generated in the first instance, out of the two internal signals generated by recognition of write command CMD, and then inverted to a high level by the write execute signal WR2. By receiving the write command CMD, the data output section 16A (FIG. 2) selects the cell data DMC and is controlled to select the retained data DR at a predetermined timing Herein, the predetermined timing is a preparation completion timing necessary for writing the uptake data into the memory cell after uptake of data into the data input buffer 22A and is, for example, a start-up completion timing of a bias voltage source necessary for the writing of data.

The test procedure by the circuit block shown in FIG. 2 is further explained by the operation waveform in FIG. 4. When write data DA is set as data DI and write command WCMD is inputted into the memory section 19A, the write command WCMD is decoded by the command decoder 21A, and the data uptake signal WR1 and write signal W are activated to high level.

By transition of data uptake signal WR1 to a high level, write data DA is taken into the data input buffer 22A. The write data DA taken into the data input buffer 22A is also held in the data register 15A as uptake data DIN, and write data DA is held as retained data DR and outputted to the write circuit 25A. In the test circuit 14A, the select signal S is inverted to a low level. Then, since the cell data DMC is selected as output data DO, the write data DA will not be outputted.

The write control circuit 24A, along with an input of write signal W, activates the write execute signal WR2 to switch to a high level after a predetermined timing. After transition of write execute signal WR2 to a high level, the select signal S is inverted to a high level. As a result, retained data DR is selected as output data DO and, along with activation of data uptake signal WR1, the write data DA held in the data register 15A is outputted.

By activation of data uptake signal WR1, the cell data DMC is outputted as output data DO and, by activation of write execute signal WR2, the write data DA is outputted. By detection of data outputted as output data DO, it is tested whether generation, propagation or recognition of write command WCMD is normal or not. In this case, the timing of two recognition signals activated successively can be detected, and the time delay from generation of data uptake signal WR1 to generation of write execute signal WR2 can also be inspected. At the same time, it is also tested whether generation or propagation of write data is normal or not.

In particular, in the nonvolatile memory capable of rewriting electrically, such as flash memory, it takes a longer time for the write operation of data into the memory cell as compared with the read operation of data from the memory cell, but in the memory system and/or test method of the first embodiment of the present invention, the write command and data lines can be tested without actually writing the write data into the memory cell, thereby shortening the test time required.

Figure 5:
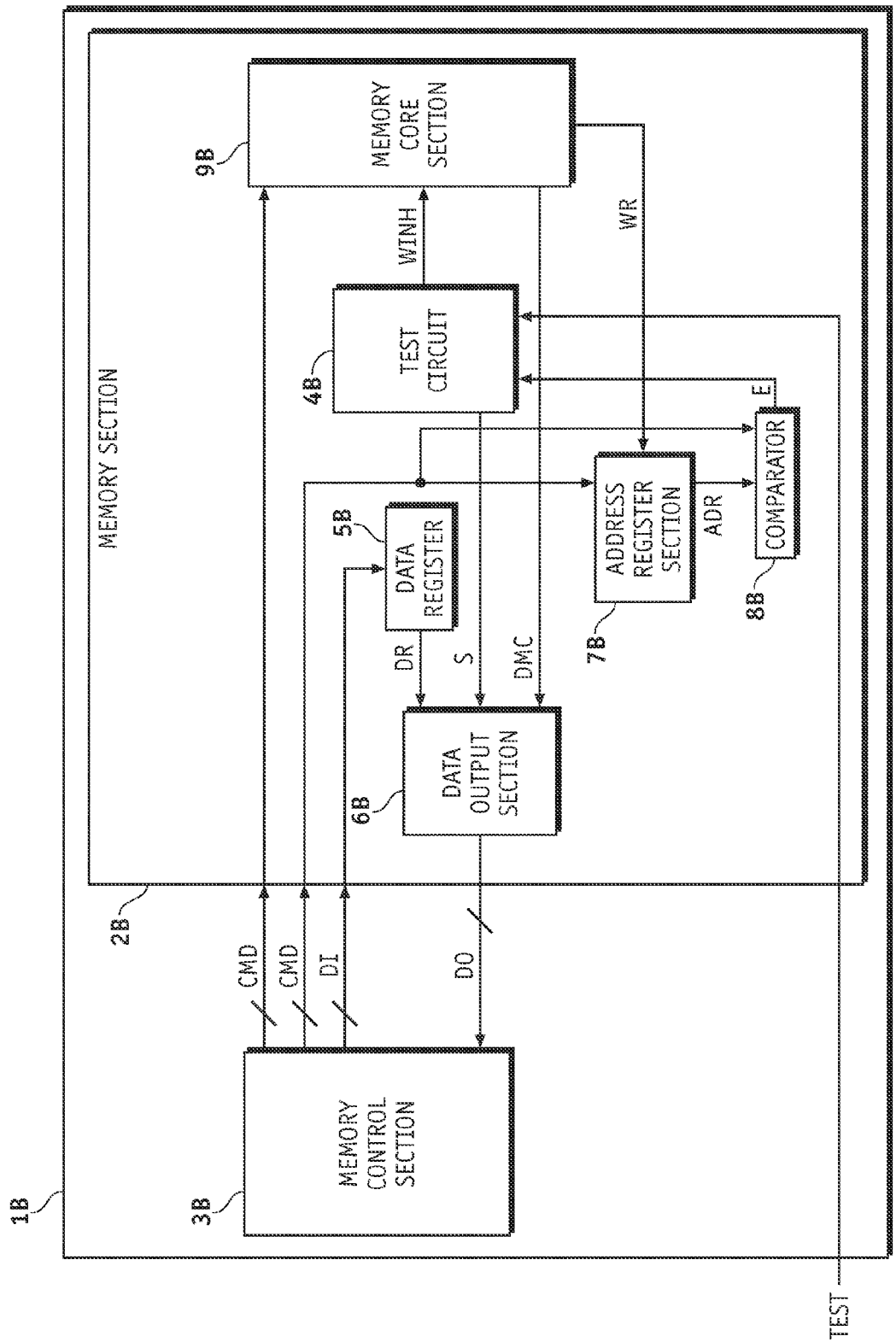
FIG. 5 is a block diagram showing a second embodiment of the present invention.

FIG. 5 is a block diagram showing a second embodiment of the present invention. A memory system 1B comprises, similar to the memory system 1A in the first embodiment of the present invention (FIG. 1), a memory section 2B and a memory control section 3B. The memory control section 3B sends out access command CMD and data DI to the memory section 2B, and receives output data DO from the memory section 2B. In addition, the memory control section 3B sends out address signal ADD.

The memory section 2B includes a data register 5B, a data output section 6B, and a memory core section 9B, which have the same structure and action as the data register 5A, data output section 6A, and memory core section 9A of the memory section 2A of FIG. 1. The memory section 2B further includes a test circuit 4B instead of the test circuit 4A, and also comprises an address register section 7B and a comparator 8B. Only the structure and action different from the memory section 2A (FIG. 1) are explained hereinbelow, and description of similar structure and action is omitted.

The address register section 7B receives and holds address signal ADD outputted from the memory control section 3B on the basis of write instruction recognition signal WR. Retained address signal ADR is then outputted to the comparator 8B.

The comparator 8B receives address signal ADD in addition to the retained address signal ADR, and compares the two signals. When the two signals coincide, a coincidence signal E is outputted to the test circuit 4B.

When the test signal TEST is activated for the test state, write inhibit signal WINH is outputted from the test circuit 4B, and the write operation in a memory cell of memory core section 9B is inhibited regardless of the write command CMD. In this state, writing command CMD, data DI and address signal ADD are input to the memory section 2B by the memory control section 3B. The data DI is held in the data register 5B and the write command CMD is inputted into the memory core section 9B. In the memory core section 9B, the command is decoded and, when it is recognized as write command CMD, a write instruction recognition signal WR is generated. The write instruction recognition signal WR is a control signal when taking in the data DI or writing into the memory cell in the memory core section 9B and, at the time of testing, writing into the memory cell is inhibited by the write inhibit signal WINH.

The test circuit 4B changes the select signal S depending on coincidence or non-coincidence of the comparison result as indicated by comparison coincidence signal E outputted from the comparator 8B. That is, the select signal S is inverted when the write command CMD outputted from the memory control section 3B is a normal command, normally transmitted to the memory core section 9B in the memory section 2B, and normally decoded in the memory core 9B and recognized to be a write command, and when the same address signal ADD outputted twice from the memory control section 3B during the cycle of a write command and after is confirmed to be normally generated and propagated to the memory section 2B.

It is hence possible to confirm operations such as normal generation of write command CMD, data DI, and address signal ADD in the memory control section 3B, normal recognition of write command CMD by the command decoder in the memory section 2B and normal generation of write instruction recognition signal WR by its recognition, and confirmation of signal routes of write command CMD, data DI, DO, and address signal ADD, without executing the write operation of data into the memory cell.

Figure 6:
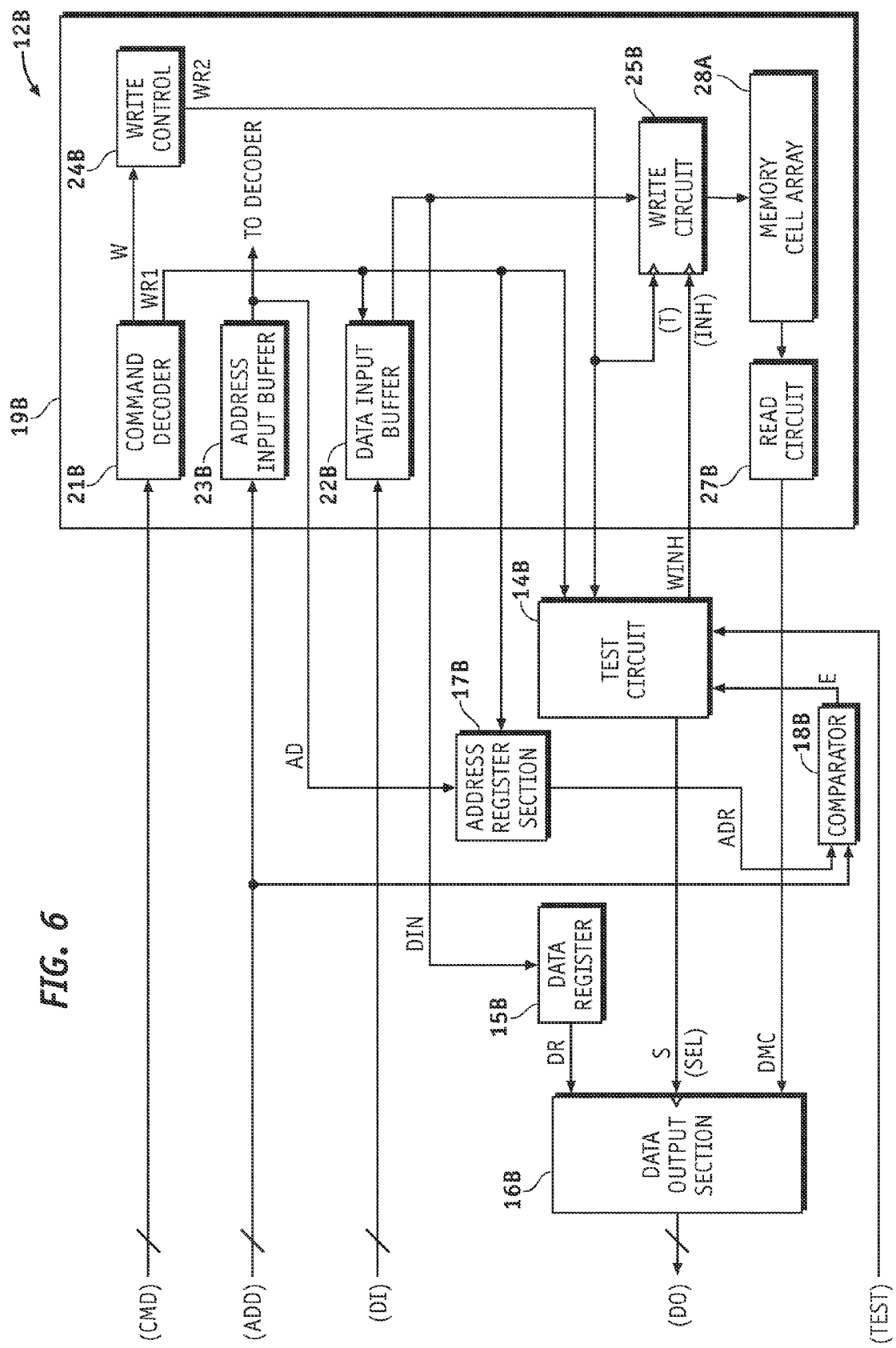
FIG. 6 is a circuit block diagram showing a memory section in accordance with the second embodiment of FIG. 5.
Figure 7:
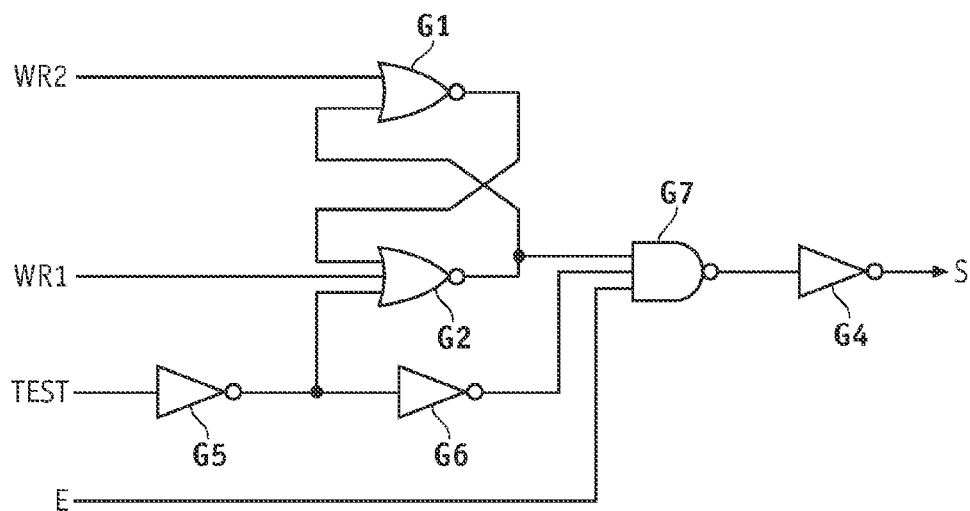
FIG. 7 is a circuit example of test circuit in accordance with the second embodiment of FIG. 5.
Figure 8:
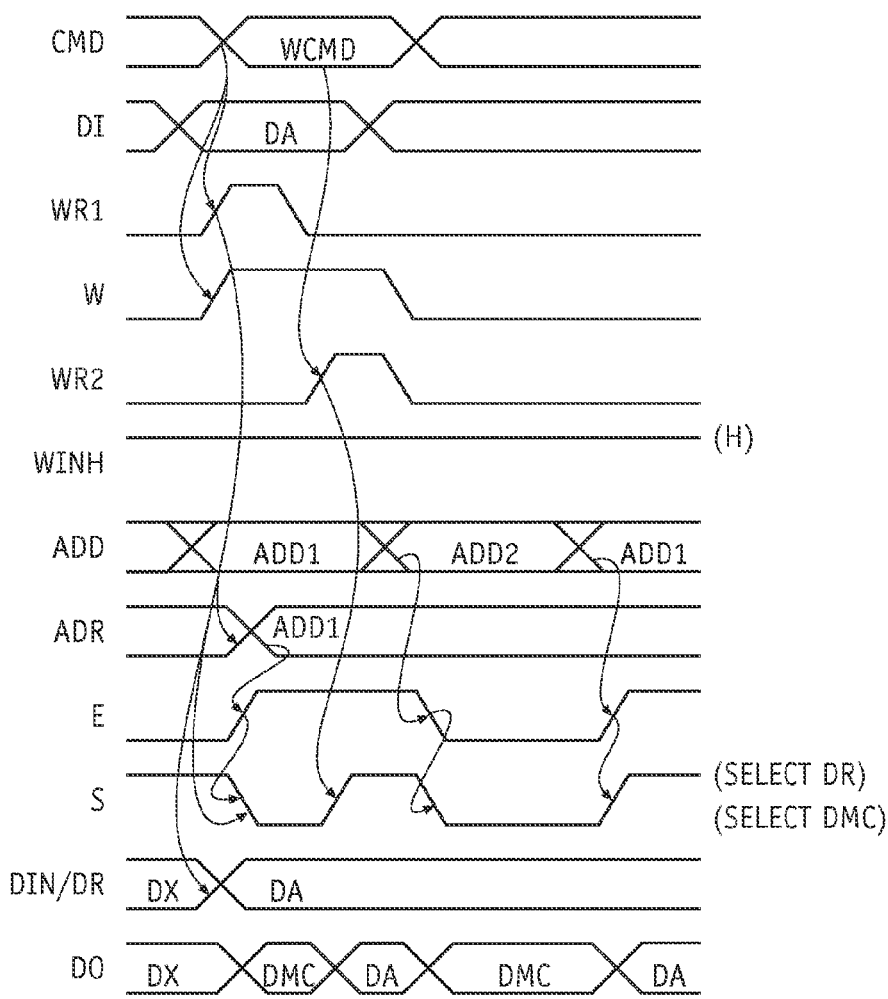
FIG. 8 is an operation waveform showing a test procedure in accordance with the second embodiment of FIG. 5.

The second embodiment is further described in FIG. 6 to FIG. 8. FIG. 6 is a circuit block diagram of memory section 12B of the second embodiment. A data register 15B, a data output section 16B, and a memory core section 19B, a command decoder 21B, a data input buffer 22B, a write control circuit 24B, a write circuit 25B, a read circuit 27B, and a memory cell array 28B have the same structure and action as the memory section 12A (FIG. 2) of the first embodiment. The memory section 12B also includes a test circuit 14B instead of the test circuit 14A, and further comprises an address register section 17B and a comparator 18B. From the memory control section (not shown), access command CMD, data DI, and address signal ADD are received. The structure and action different from the memory section 12A (FIG. 2) are explained below, and description of the same structure and action is omitted.

An output terminal of address input buffer 23B is connected to the address decoder not shown, and is also connected to the address register section 17B for outputting the uptake address signal AD received by the address input buffer 23B to the address decoder and the address register section 17B.

In the memory section 12B of the second embodiment (FIG. 6), the data uptake signal WR1 outputted from the command decoder 21B is inputted into the address register section 17B and the test circuit 14B, as well as the data input buffer 22B. The write execute signal WR2 outputted from the write control circuit 24B is outputted to the test circuit 14B and the write circuit 25B, as in the first embodiment.

The address register section 17B outputs retained address ADR held on the basis of data uptake signal WR1 to the comparator 18B. The comparator 18B also receives address signal ADD and compares both address signals. When coinciding as a result of the comparison, a coincidence signal E is outputted to the test circuit 14B.

A circuit example of the test circuit 14B in accordance with the second embodiment of the present invention is shown in FIG. 7. Instead of the gate G3 in the circuit example of the test circuit 14A in the first embodiment (FIG. 3), a NAND gate G7 having one more input terminal than the gate G3 is provided. In the increased input terminal in the gate G7, the coincidence signal E outputted from the comparator 18B is entered.

In the circuit example in FIG. 7, in addition to the inversion operation of the select signal S depending on the comparison result of the address signal ADD entered before and after write operation explained in the description of FIG. 5, this circuit inverts the select signal S by the data uptake signal WR1 and write execute signal WR2, as the write command recognition signal explained in connection with FIG. 3.

That is, the select signal S when testing (TEST=Hi) is changed to low level as a result of activation of data uptake signal WR1 (WR1=Hi) generated by input of write command CMD, and changed to high level as a result of activation of write execute signal WR2 (WR2=Hi) generated after a predetermined timing, and maintains the high level as the address signal ADD entered later coincides with the retained address signal ADR entered and held during write cycle.

In regards to the circuit of FIG. 7, at the time of re-input of address signal ADD after write cycle, by entering an address signal ADD of same value after an address signal ADD of different value from the retained address ADR, the select signal S is changed over before and after, so that the generation and propagation of address signal ADD can be confirmed securely.

The test procedure by the circuit shown in FIG. 6 is further explained by the operation waveform in FIG. 8. When write data DA is set as data DI, address signal ADD1 is set as address signal ADD, and write command WCMD is put into the memory section 19B, the write command WCMD is decoded by the command decoder 21B, and the data uptake signal WR1 and write signal W are activated to a high level. Further, as the data uptake signal WR1 is activated to the high level, the uptake address signal AD is held in the address register section 17B, and address signal ADD1 is held as retained address signal ADR. At this time, the comparator 18B compares the address signal ADD and retained address signal ADR, both having the address signal ADD1 of same value, and the coincidence signal E is activated to a high level but, as a result of activation of data uptake signal WR1, the output of the flip-flop circuit (FIG. 7) of the test circuit 14B becomes a low level and, hence, the select signal S becomes low level. Incidentally, comparison of address signal ADD and retained address signal ADR may be also executed by a signal of an address transition detector.

By transition of data uptake signal WR1 to a high level, write data DA is taken into the data input buffer 22B. The write data DA taken into the data input buffer 22B is held in the data register 15B as uptake data DIN, and write data DA is held as retained data DR, and is outputted to the write circuit 25B.

In this state, since the cell data DMC is selected as output data DO by the select signal S of a low level, the write data DA will not be outputted.

The write control circuit 24B, along with the input of write signal W, activates the write execute signal WR2 to a high level after a predetermined timing. After transition of write execute signal WR2 to a high level, the select signal S is inverted to the high level on the condition that the address signal ADD is not transitional. As a result, retained data DR is selected as output data DO and, along with activation of data uptake signal WR1, the write data DA held in the data register 15B is outputted.

After expiration of the write cycle, the address signal ADD is transitioned from the address signal ADD1 to address signal ADD2. The retained address signal ADR is held in the address signal ADD1 and, thus, an output of non-coincidence is outputted from the comparator 18B. The coincidence signal E is set to a low level and the select signal S is also set to the low level. Further, when the address signal ADD2 is transitioned to address signal ADD1, the result of comparison coincides. The coincidence signal E is activated to a high level and the select signal S is also changed to a high level. Detection of transition from address signal ADD1 to address signal ADD2 may also be executed by an address transition detector not shown.

By activation of data uptake signal WR1, the cell data DMC is outputted as output data DO, and by activation of write execute signal WR2, the write data DA is outputted. Further, by changing the address signal ADD to a value different from the retained address ADR, cell data DMC is outputted, and by returning the address signal ADD to the value of retained address signal ADR, the write data DA is outputted again. By detection of data outputted as output data DO, it is tested whether generation, propagation or recognition of write command WCMD is normal or not, whether generation or propagation of write data is normal or not, and whether generation or propagation of address signal is normal or not. In this case, as in the first embodiment, it is possible to detect the time delay from generation of data uptake signal WR1 until generation of write execute signal WR2.

In particular, in a nonvolatile memory capable of rewriting electrically, such as a flash memory, it takes a longer time for the write operation of data into the memory cell as compared with the read operation of data from the memory cell, but in the memory system and/or test method in accordance with the second embodiment, the write command, data lines, and address signal lines can be tested without actually writing the write data into the memory cell, thereby shortening the test time required.

Figure 9:
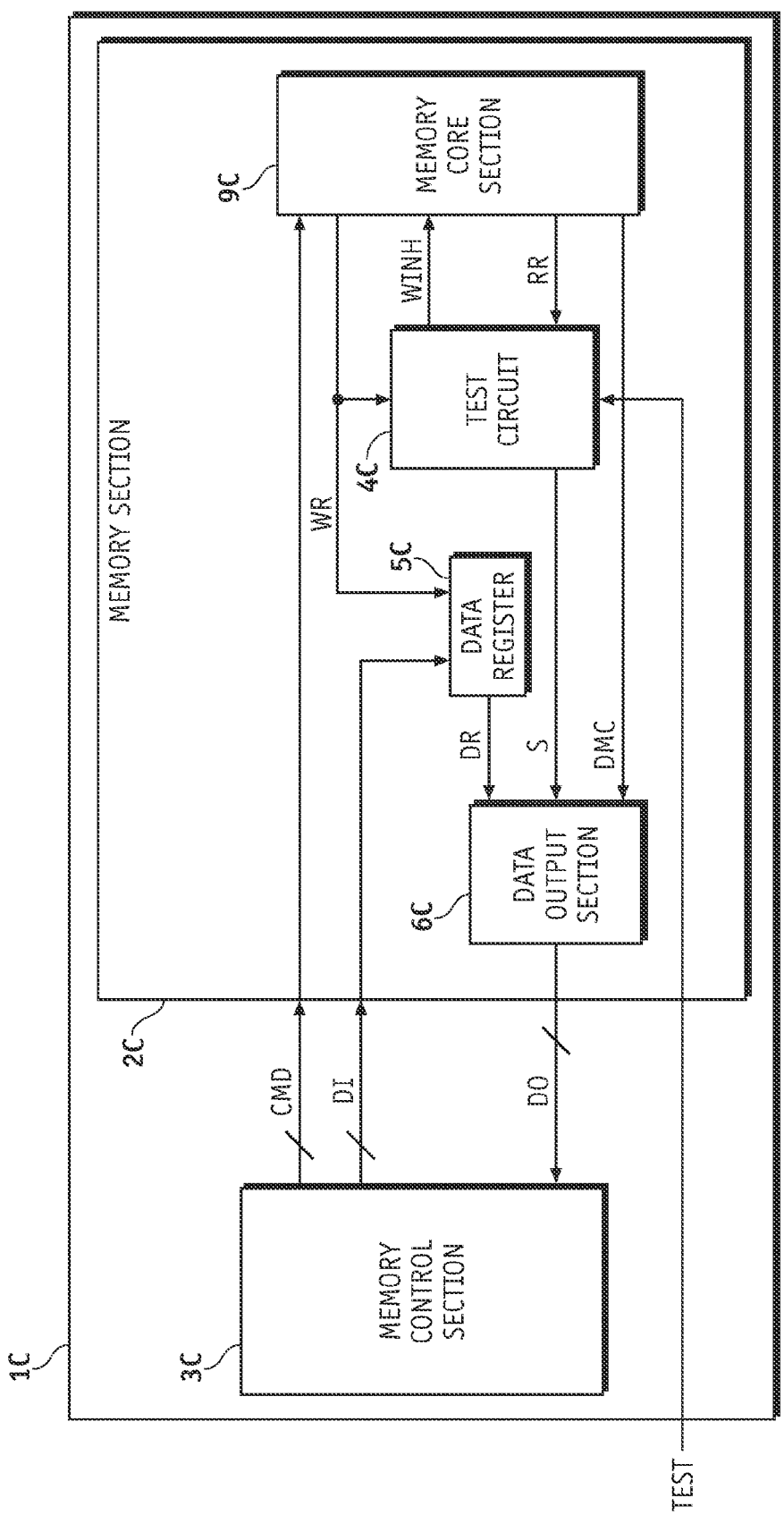
FIG. 9 is a block diagram showing a third embodiment of the present invention.

FIG. 9 is a block diagram showing a third embodiment of the present invention. A memory system IC comprises, similar to the memory system 1A of the first embodiment of the present invention (FIG. 1), a memory section 2C and a memory control section 3C. The memory control section 3C sends out access command CMD and data DI to the memory section 2C, and receives output data DO from the memory section 2C.

The memory section 2C includes a data output section 6C similar to the data output section 6A in the memory section 2A, and has the same structure and action. The memory section 2C further includes a test circuit 4C instead of the test circuit 4A, and also comprises a data register 5C instead of the data register 5A. Only the structure and action different from the memory section 2A (FIG. 1) are explained, and description of same structure and action is omitted.

The data register 5C receives and holds data DI outputted from the memory control section 3C on the basis of write instruction recognition signal WR. Retained data DR is outputted to the data output section 6C.

When the test signal TEST is activated during the test state, write inhibit signal WINH is outputted from the test circuit 4C, and the write operation in a memory cell of memory core section 9C is inhibited regardless of the write command CMD. In this state, write command CMD and data DI, and successively read command CMD are output from the memory control section 3C. When the write command CMD is inputted into the memory core section 9C, the command is decoded and, when it is recognized to be write command CMD, a write instruction recognition signal WR is generated. On the basis of the write instruction recognition signal WR, the data DI is held in the data register 5C. The write instruction recognition signal WR is a control signal when taking in the data DI or writing into the memory cell in the memory core section 9C and, at the time of testing, writing into the memory cell is inhibited by the write inhibit signal WINH.

Following write command CMD, read command CMD is inputted into the memory core section 9C. The command is decoded and, when it is recognized to be read command CMD, a read instruction recognition signal RR is generated. The read instruction recognition signal RR is outputted from the memory cell in the memory core section 9C and is inputted to the test circuit 4C.

The test circuit 4C inverts the select signal S on the basis of the write instruction recognition signal WR and read instruction recognition signal RR. That is, the select signal S is inverted when the write command CMD and read command CMD outputted from the memory control section 3C are normal commands, normally transmitted to the memory core section 9C in the memory section 2C, normally decoded in the memory core section 9C and, thus, recognized to be normal commands.

It is therefore possible to test confirm operations such as normal generation of write command CMD, data DI, and read command CMD in the memory control section 3C, normal recognition of command by a command decoder in the memory section 2C, and normal generation of instruction recognition signals WR, RR by recognition, and confirmation of signal routes of write/read command CMD, data DI, DO, without executing the write operation of data into the memory cell.

Figure 10:
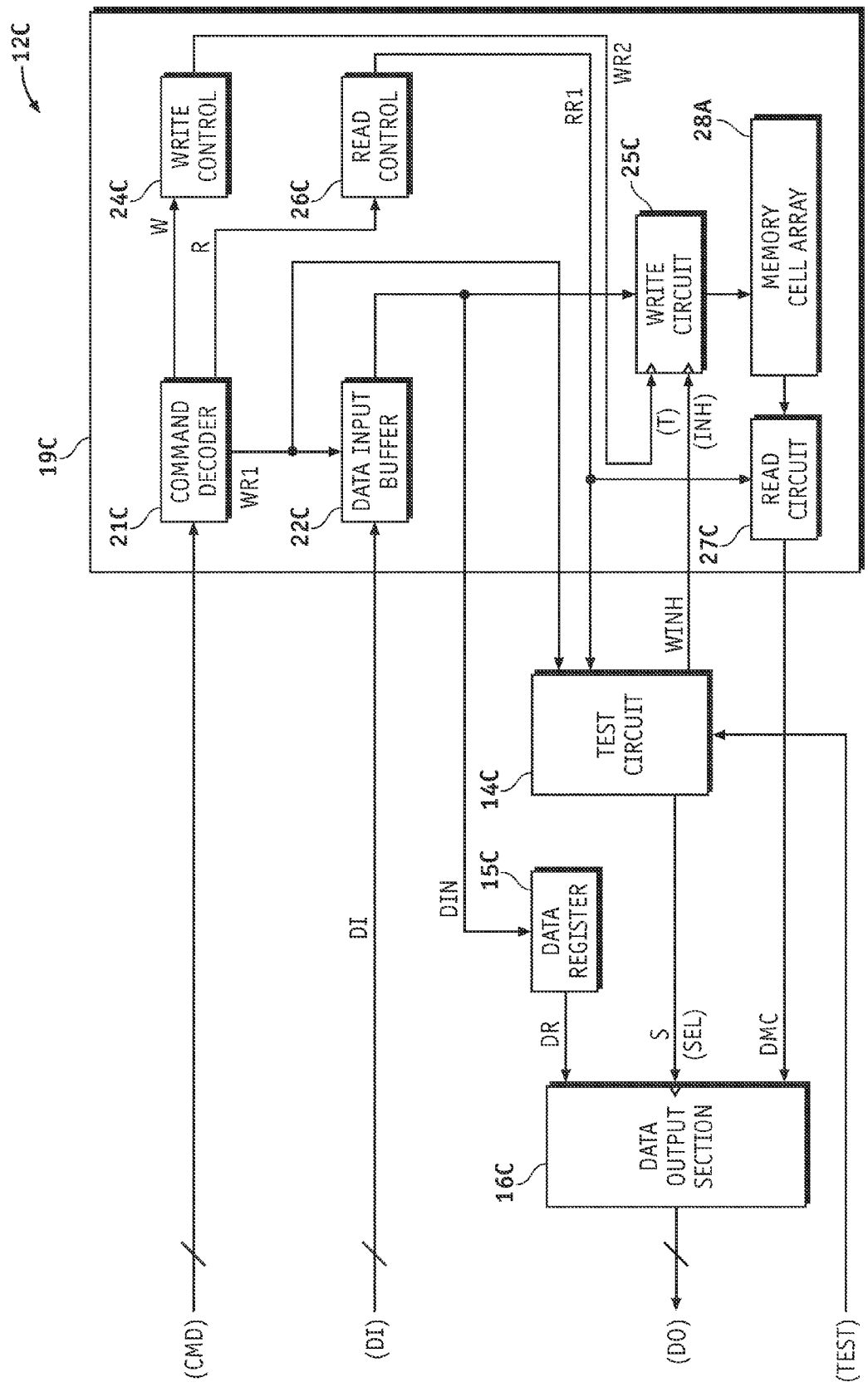
FIG. 10 is a circuit block diagram showing a memory section in accordance with the third embodiment of FIG. 9.
Figure 11:
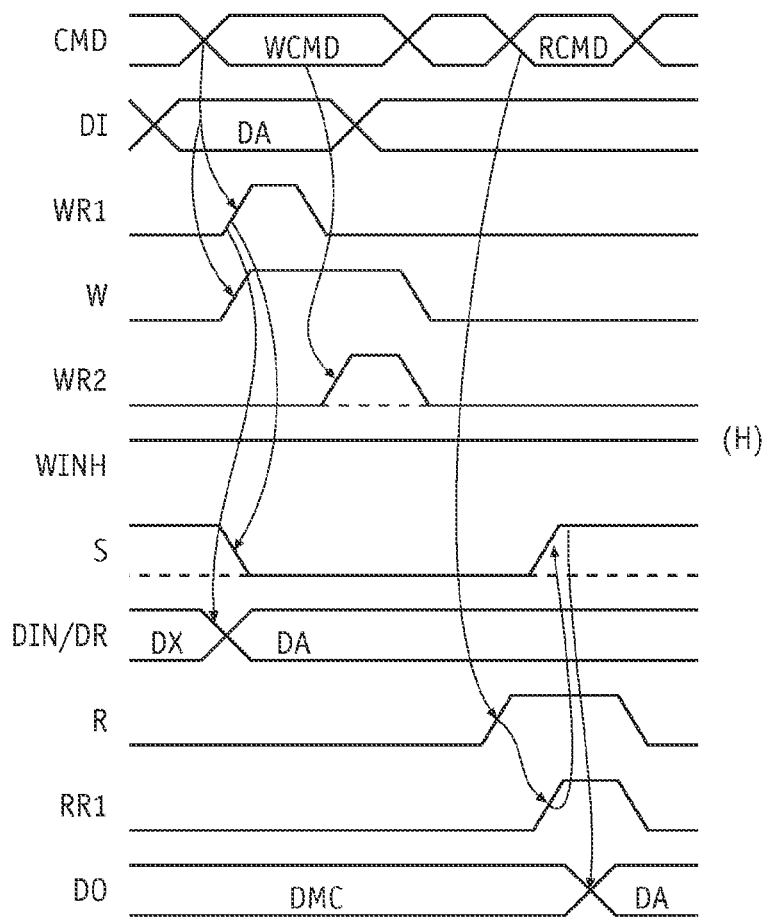
FIG. 11 is an operation waveform showing a test procedure in accordance with the third embodiment of FIG. 9.

The third embodiment is shown in more detail in FIG. 10 and FIG. 11. FIG. 10 is a circuit block diagram of memory section 12C in accordance with the third embodiment of the present invention. The data register 15C, data output section 16C, and memory core section 19C, the data input buffer 22C, write control circuit 24C, write circuit 25C, and memory cell array 28C have the same structure and action as the memory section 12A (FIG. 2) of the first embodiment. The memory section 12C includes a test circuit 14C instead of the test circuit 14A, and further comprises a command decoder 21C for decoding the read command CMD instead of the command decoder 21A, and further comprises a read control circuit 26C. The memory section 12C also comprises a read circuit 27C controlled by a data output signal RR1 instead of a read circuit 27A. From the memory control section not shown, access command CMD and data DI are entered. The structure and action different from the memory section 12A (FIG. 2) are explained below, and description of the same structure and action is omitted.

The data register 15C has a similar structure as the data register 15A (FIG. 2). In accordance with the third embodiment of the present invention, in the block diagram of FIG. 9, the data DI during a write cycle is directly controlled by write instruction recognition signal WR and is held, but in the configuration shown in FIG. 10, the data uptake signal WR1 controls the data input buffer 22C and takes in the data DI. The taken in data DIN is held. In this case, too, the data DI can be held during the write cycle and the same action and effect of the third embodiment of the present invention can be obtained.

In the memory section 12C (FIG. 10) of the third embodiment, write execute signal WR2 outputted from the write control circuit 24C is inputted to the write circuit 25C. The data output signal RR1 outputted from the read control circuit 26C is inputted to the read circuit 27C and is also inputted to the test circuit 14C.

The circuit of test circuit 14C has a circuit configuration similar to that of the circuit (FIG. 3) in accordance with the first embodiment. Data output signal RR1 is entered as an input signal instead of the write execute signal WR2 in the circuit of the first embodiment.

That is, the select signal S when testing (TEST=Hi) is changed to a low level as a result of activation of data uptake signal WR1 (WR1=Hi) generated by the input of write command CMD, and changed to a high level as a result of activation of data output signal RR1 (RR1=Hi) generated as a result of input of read command CMD entered in succession to the write command CMD.

The test procedure of the circuit block diagram shown in FIG. 10 is explained by the operation waveform of FIG. 11. When write data DA is set as data DI and write command WCMD is put into the memory section 19C, the write command WCMD is decoded by the command decoder 21C and the data uptake signal WR1 and write signal W are activated to a high level. Further, as the data uptake signal WR1 is activated to a high level, the select data S outputted from the test circuit 14C becomes low level.

By transition of data uptake signal WR1 to the high level, write data DA is taken into the data input buffer 22C. The write data DA taken into the data input buffer 22C is held in the data register 15C as uptake data DIN and write data DA is held as retained data DR and is outputted toward the write circuit 25C.

Then, the select signal S is at low level and the cell data DMC is selected as output data DO and, hence, the write data DA will not be outputted.

The write control circuit 24C, along with input of write signal W, activates the write execute signal WR2 to a high level after a predetermined timing. The write execute signal WR2 at a high level triggers the write circuit 25C. However, since write inhibit signal WINH is outputted from the test circuit 14C, write operation into memory cell array 28C is not executed.

After expiration of the write cycle, read command RCMD is put into the memory section 19C. Being decoded by the command decoder 21C, the read signal R is activated to a high level. The read control circuit 26C, along with the input of the read signal R, activates the data output signal RR1 to a high level. The data output signal RR1 at a high level triggers the read circuit 27C and is outputted toward the test circuit 14C, and inverts the select signal S to a high level. As a result, the retained data DR is selected as output data DO and the write data DA held in the data register 15C is outputted as write data DA.

By activation of data uptake signal WR1, the cell data DMC is outputted as output data DO, and by activation of data output signal RR1, the write data DA is outputted. By detection of data outputted as output data DO, it is tested whether generation, propagation or recognition of write command WCMD and read command RCMD is normal or not, and whether generation or propagation of write data is normal or not.

In particular, in a nonvolatile memory capable of rewriting electrically, such as flash memory, it takes a longer time for the write operation of data into the memory cell as compared with the read operation of data from the memory cell, but in the memory system and/or test method of the third embodiment, the write/read command and data lines can be tested without actually writing the write data into the memory cell, thereby shortening the test time.

In the first to third embodiments, the circuit for holding the data DI comprises the data register 15A to 15C, aside from the data input buffer 21A to 21C, but it may alternatively be defined as one function of the data input buffer 21A to 21C. On the basis of the data uptake signal WR1, the data input buffer 21A to 21C takes in the data DI and the data register 15A to 15C holds the data DIN statically as explained above, but the data register 15A to 15C may alternatively be configured to hold the data on the basis of the data uptake signal WR1.

FIG. 12 and FIG. 13 schematically show a configuration for saving current consumption when not testing by activating the test circuit only when testing. FIG. 12 shows a case of activating the data register and address register by test signal TEST. By disposing the data register and address register separately from the data input buffer or address input buffer, these registers can be activated only when testing. FIG. 13 shows a configuration of activating the comparator by test signal TEST. Since the comparator is not necessary for access operation when not testing, it can be activated only when testing.

Various methods may be considered as the method of activation. By disposing a logic gate for receiving an enable signal, only when activating the test signal TEST in the case of testing, it may be defined to propagate a signal from the logic gate, or it may be composed to connect or disconnect the supply voltage or bias current/voltage directly by the test signal TEST.

The data uptake signal WR1 and write execute signal WR2 are examples of write instruction recognition signal WR, and the data output signal RR1 is an example of read instruction recognition signal RR.

As explained herein, according to the several embodiments of the present invention, without actually writing data into the memory cell in the memory cell array 28A to 28C, it is possible to test whether generation, propagation or recognition of write command WCMD or read command RCMD is normal or not, and test whether the data line routes or address signal line routes are normal or not.

More specifically, without actually writing data into the memory cell, it is possible to test whether the control circuit of memory control section operates normally or not, whether the command decoder of the memory section operates normally or not, whether the control signals are normally generated or not depending on the decoding operation, and whether the command propagation routes and data and address signal propagation routes are normal or not.

In particular, when the memory capacity is large, or when a longer time is needed for writing data into the memory cell as compared with the circuit operation, the test time associated with a write command can be shortened.

The invention is not limited to the foregoing embodiments alone, but may be changed and modified within the scope of the invention.

For example, the first to third embodiments are intended to test independently, but optional tests may be combined and executed therewith.

Instead of the write command, testing of the erase command can be similarly executed. For example, known data is held preliminarily in a data register and when the erase command is decoded by the command decoder, the select signal S is changed over on the basis of a recognition signal showing that the erase command is recognized, so that the generation, propagation or recognition of the erase command can be tested in the memory system without waiting for completion of data erasure in the memory cell. In this case, preferably, the erase operation inhibit signal should be generated instead of the write inhibit signal, and the actual erase operation should be inhibited.

What is claimed is:

1. A memory system comprising:
   a memory control section for providing a write instruction; and a memory section for storing and providing data in response to instructions received from the memory control section, the memory section comprising a data output section for providing the data to the memory control section in response to receiving the write instruction from the memory control section during operation of the memory system in a test mode.

2. A memory system according to claim 1, wherein writing the data to a memory cell in the memory section is prohibited during operation in the test mode.

3. A memory system according to claim 1,
wherein the memory section comprises a first register section to which the data is inputted in response to the write instruction, and
wherein the data output section is connected to the first register section and, in response to receiving the write instruction during operation in the test mode, generates a data write recognition signal and signals the first register section to provide the data stored in the first register section to the memory control section.

4. A memory system according to claim 3, wherein the first register section stores the data inputted thereto in response to receiving the data write recognition signal.

5. A memory system according to claim 3, wherein the first register section is a data input buffer.

6. A memory system according to claim 3, wherein the first register section is activated during operation in the test mode and stores the data inputted thereto in response to receiving the data write recognition signal.

7. A memory system according to claim 3, wherein the data output section comprises a switch section for controlling provision of signals to a data output terminal either from the first register section or from a memory cell in the memory section.

8. A memory system according to claim 3, wherein
the data write recognition signal comprises a first data write recognition signal and a second data write recognition signal generated sequentially with a predetermined time difference therebetween, and wherein
the data output section is disconnected from the first register section in response to the first data write recognition signal and connected to the first register section in response to the second data write recognition signal.

9. A memory system according to claim 8, wherein the first data write recognition signal comprises a signal for receiving and storing external data from outside the memory section, and the second data write recognition signal comprises a signal for receiving and storing the data from a memory cell in the memory section.

10. A memory system according to claim 1 wherein,
the memory section further comprises:
a second register section for storing a first address signal inputted to the memory section in response to the write instruction as a stored address signal; and
a comparator section for comparing the first address signal inputted after termination of a data write cycle and the stored address signal stored in the second register section, and wherein
the data output section is coupled to the comparator section for outputting the data to the memory control section during operation in a test mode in response to the comparator determining coincidence of the first address signal inputted after termination of the data write cycle and the stored address signal.

11. A memory system according to claim 10 wherein,
the memory section further comprises a first register section for storing the data inputted with the write instruction, and wherein
the data output section is further coupled to the first register section and outputs data stored in the first register section to the memory control section during operation in the test mode in response to the comparator determining coincidence of the first address signal inputted after termination of the data write cycle and the stored address signal.

12. A memory system according to claim 11, wherein the data output section is disconnected from the first register section in response to a data write recognition signal generated upon recognition of the write instruction.

13. A memory system according to claim 10, wherein the second register section stores the first address signal in response to a data write recognition signal generated upon recognition of the write instruction.

14. A memory system according to claim 10, wherein
a second address signal different from the first address signal is inputted prior to input of the first address signal after termination of a data write cycle, and wherein
the comparator section compares the second address signal with the stored address signal stored in the second register section.

15. A memory system according to claim 10, wherein the comparator section includes an address transition detector section.

16. A memory system according to claim 10, wherein the second register section and the comparator section are activated during operation in the test mode.

17. A memory system according to claim 1, wherein the data output section outputs the data to the memory control section during operation in the test mode upon recognition of both the write instruction and a readout instruction following the write instruction.

18. A memory system according to claim 17, wherein
the memory section comprises a first register section for storing the data inputted along with the write instruction, and wherein
the data output section is connected to the first register section upon recognition of both the write instruction and the readout instruction following the write instruction, and outputs the data stored in the first register section to the memory control section during operation in the test mode.

19. A memory system according to claim 18, wherein the data output section is disconnected from the first register section in response to the data write recognition signal.

20. A test method for a memory system comprising a memory control section for providing a write instruction and a memory section for storing and providing data in response to signals from the memory control section, the method comprising the step of:
in the memory section, outputting the data to the memory control section in response to receiving the write instruction during operation in a test mode.

21. A test method for a memory system according to claim 20, wherein the step of outputting the data to the memory control section comprises the step of outputting the data to the memory control section without writing the data in a memory cell of the memory section.

22. A test method for a memory system according to claim 20, wherein the step of outputting the data to the memory control section comprises the steps of:

storing the data along with the write instruction in the memory section; and outputting the data stored in the memory section to the memory control section in response to the write instruction.

23. A test method for a memory system according to claim 20, wherein the step of outputting the data to the memory control section comprises the step of outputting the data from a data output terminal of the memory section to the memory control section.

24. A test method for a memory system according to claim 20, wherein the step of outputting the data to the memory control section comprises the steps of:

ceasing output of the data along with timing to fetch the data from outside of the memory section in response to the write instruction; and outputting the data along with timing to store the data fetched to the memory section in a memory cell.

25. A test method for a memory system according to claim 20, wherein the step of outputting the data to the memory control section comprises, in the memory section, the steps of:

storing a first address signal inputted upon recognition of the write instruction;

re-inputting the first address signal thereto after termination of a data write cycle for comparison with an address signal already stored therein; and outputting the data inputted to the memory section to the memory control section in response to coincidence of the first address signal re-inputted to the memory control section and the address signal already stored therein.

26. A test method for a memory system according to claim 25, wherein the step of outputting the data inputted to the memory section to the memory control section comprises the step of:

ceasing output of the data in response to the write instruction; and outputting the data in response to coincidence of the first address signal re-inputted to the memory control section and the address signal already stored therein.

27. A test method for a memory system according to claim 25, wherein the step of outputting the data to the memory control section further comprises the step of:

inputting a second address signal different from the first address signal prior to re-input of the first address signal; and wherein the step of outputting the data inputted to the memory section to the memory control section comprises the steps of:

ceasing output of the data in response to a comparison result that the second address signal and an address signal already stored in the memory section do not coincide; and outputting the data in response to a comparison result that the first address signal re-inputted and an address signal already stored in the memory section coincide.

28. A test method for a memory system according to claim 20, wherein the step of outputting the data to the memory control section comprises the step of, in the memory section, outputting the data inputted to the memory section to the memory control section in response to both the write instruction and the readout instruction following the write instruction.

29. A test method for a memory system according to claim 28, wherein the step of outputting the data inputted in the memory section to the memory control section comprises the step of:

ceasing inputting the data to the memory section in response to the write instruction; and outputting the data in response to the readout instruction following the write instruction.

* * * * *